United States Patent
Hara et al.

(10) Patent No.: US 8,902,670 B2
(45) Date of Patent: Dec. 2, 2014

(54) SEMICONDUCTOR MEMORY DEVICE

(71) Applicant: Kabushiki Kaisha Toshiba, Tokyo (JP)

(72) Inventors: Tokumasa Hara, Kawasaki (JP); Hiroshi Sukegawa, Tokyo (JP); Toshio Fujisawa, Yokohama (JP); Shirou Fujita, Kamakura (JP); Masaki Unno, Yokohama (JP); Masanobu Shirakawa, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/833,842

(22) Filed: Mar. 15, 2013

(65) Prior Publication Data
US 2014/0063952 A1  Mar. 6, 2014

Related U.S. Application Data

(60) Provisional application No. 61/695,752, filed on Aug. 31, 2012.

(51) Int. Cl.
| | | |
|---|---|---|
| *G11C 16/16* | (2006.01) | |
| *G11C 16/06* | (2006.01) | |
| *G11C 16/04* | (2006.01) | |
| *G11C 16/08* | (2006.01) | |
| G11C 16/34 | (2006.01) | |
| G11C 16/14 | (2006.01) | |

(52) U.S. Cl.
CPC ............ *G11C 16/06* (2013.01); *G11C 16/3445* (2013.01); *G11C 16/16* (2013.01); *G11C 16/344* (2013.01); *G11C 16/14* (2013.01); *G11C 16/0483* (2013.01); *G11C 16/08* (2013.01)

USPC .............. 365/185.29; 365/218; 365/185.11; 365/230.03

(58) Field of Classification Search
CPC .................. H01L 27/11507; H01L 27/11509; H01L 27/115; H03M 13/29; H03M 13/2906; G11C 16/16; G11C 16/14; G11C 16/3445; G11C 16/344
USPC .................... 365/185.29, 218, 185.11, 230.03
See application file for complete search history.

(56) References Cited

U.S. PATENT DOCUMENTS

| | | | |
|---|---|---|---|
| 2003/0133326 A1 | 7/2003 | Hosono et al. | |
| 2005/0144516 A1* | 6/2005 | Gonzalez et al. | 714/8 |
| 2005/0174862 A1 | 8/2005 | Watanabe et al. | |

(Continued)

FOREIGN PATENT DOCUMENTS

| | | |
|---|---|---|
| JP | 3702229 | 7/2005 |
| JP | 2005-222647 | 8/2005 |
| JP | 2007-520842 | 7/2007 |

(Continued)

*Primary Examiner* — Jason Lappas
(74) *Attorney, Agent, or Firm* — Oblon, Spivak, McClelland, Maier & Neustadt, L.L.P.

(57) ABSTRACT

According to one embodiment, a semiconductor memory device includes memory cell arrays each including blocks. The block is unit of erase and includes string-groups. Each string-group includes strings each including a first transistor, memory cell transistors, a second transistor coupled in series. The first transistor is connected to different bit line and the second transistor is connected to same source line. The memory cell arrays are provided with different respective block address signals. The memory cell arrays are provided with different respective string address signals. Each of the block address signals specifies one block. Each of the string address signals specifies one string-group.

17 Claims, 10 Drawing Sheets

(56) References Cited

U.S. PATENT DOCUMENTS

| | | |
|---|---|---|
| 2006/0146639 A1 | 7/2006 | Fasoli et al. |
| 2009/0196103 A1 | 8/2009 | Kim |
| 2009/0267139 A1 | 10/2009 | Maejima |
| 2009/0273983 A1* | 11/2009 | Lee et al. ................. 365/185.23 |
| 2010/0038703 A1 | 2/2010 | Fukuzumi et al. |
| 2011/0175159 A1 | 7/2011 | Itagaki et al. |
| 2011/0284946 A1 | 11/2011 | Kiyotoshi |
| 2012/0051138 A1* | 3/2012 | Kim et al. ................. 365/185.17 |

FOREIGN PATENT DOCUMENTS

| | | |
|---|---|---|
| JP | 2008-527585 | 7/2008 |
| JP | 2009-266280 | 11/2009 |
| JP | 2010-45149 | 2/2010 |
| JP | 2010-80729 | 4/2010 |
| JP | 2011-511391 | 4/2011 |

* cited by examiner

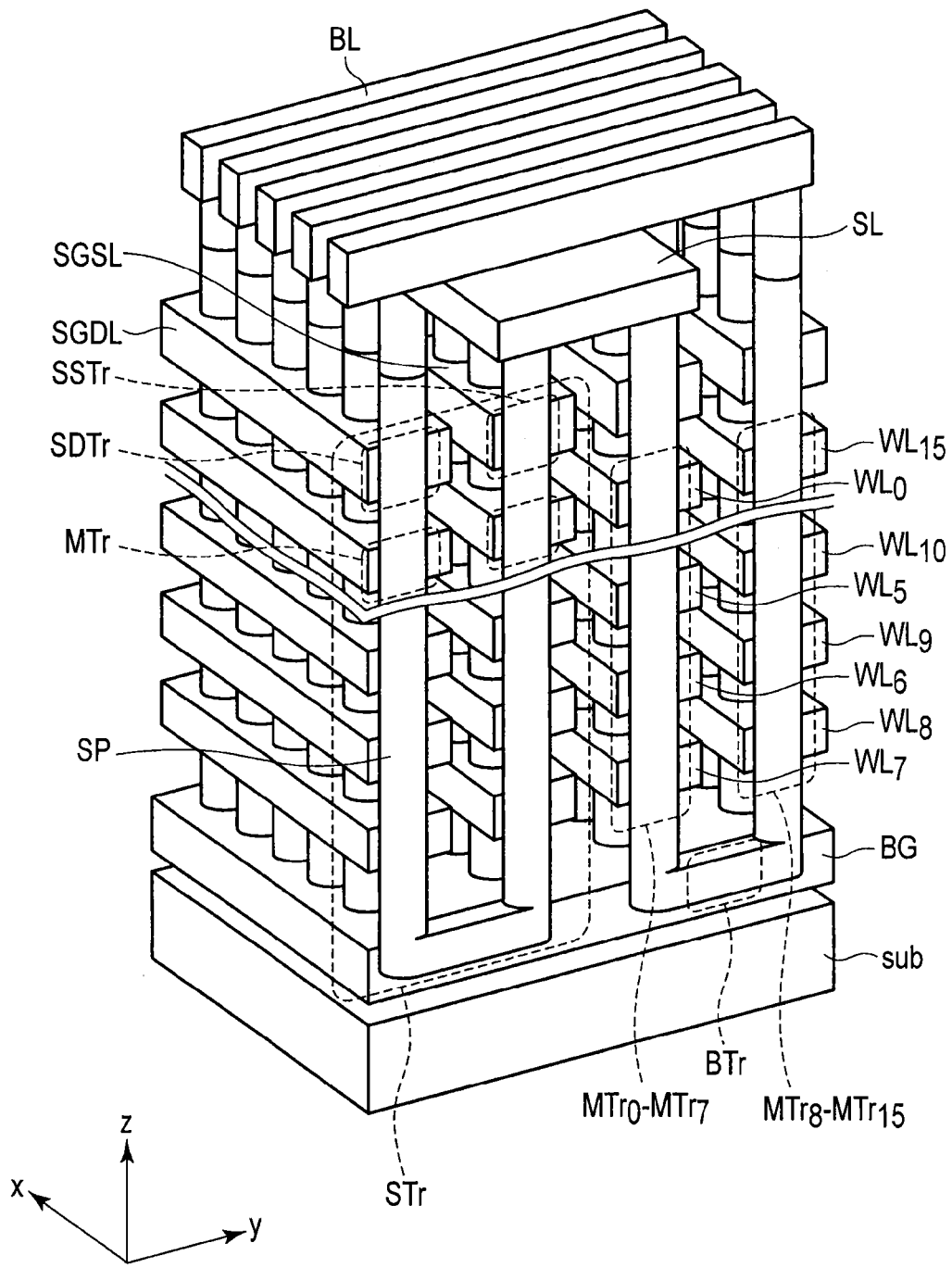
F I G. 2

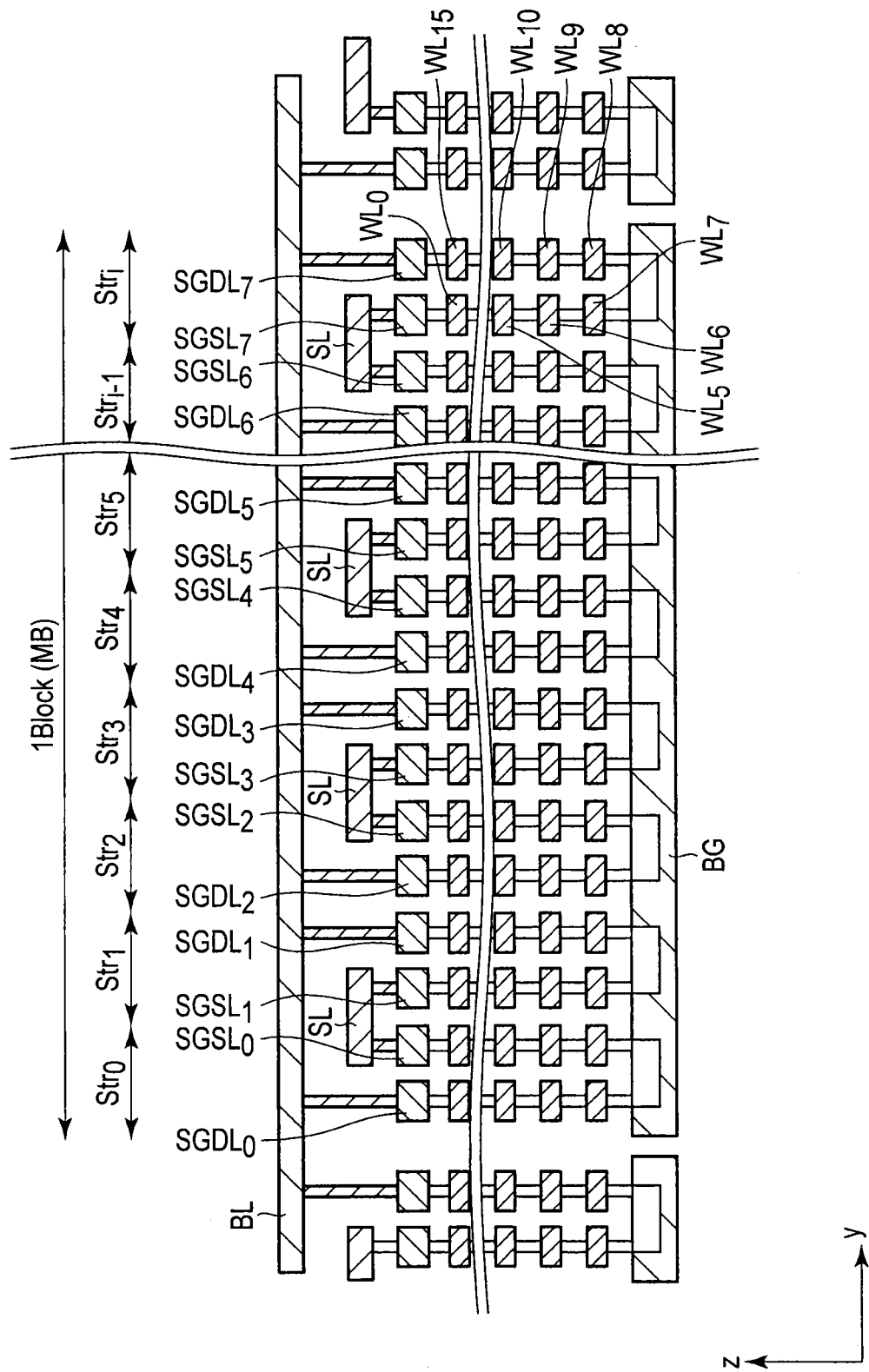
F I G. 3

SEMICONDUCTOR MEMORY DEVICE

CROSS-REFERENCE TO RELATED APPLICATIONS

This application claims the benefit of U.S. Provisional Application No. 61/695,752, filed Aug. 31, 2012, the entire contents of which are incorporated herein by reference.

FIELD

Embodiments described herein relate generally to a semiconductor memory device.

BACKGROUND

Three-dimensionally structured NAND flash memories manufactured with BiCS technique (BiCS memories) are known. BiCS memories have features different from those of conventional NAND flash memories. Because of the differences, the BiCS memories may need optimization different from that for conventional NAND flash memories.

BRIEF DESCRIPTION OF THE DRAWINGS

FIG. 2 illustrates a perspective view of a part of a memory cell array according to the first embodiment.

FIG. 3 illustrates a sectional view of a part of the memory cell array according to the first embodiment.

DETAILED DESCRIPTION

Figure 1:
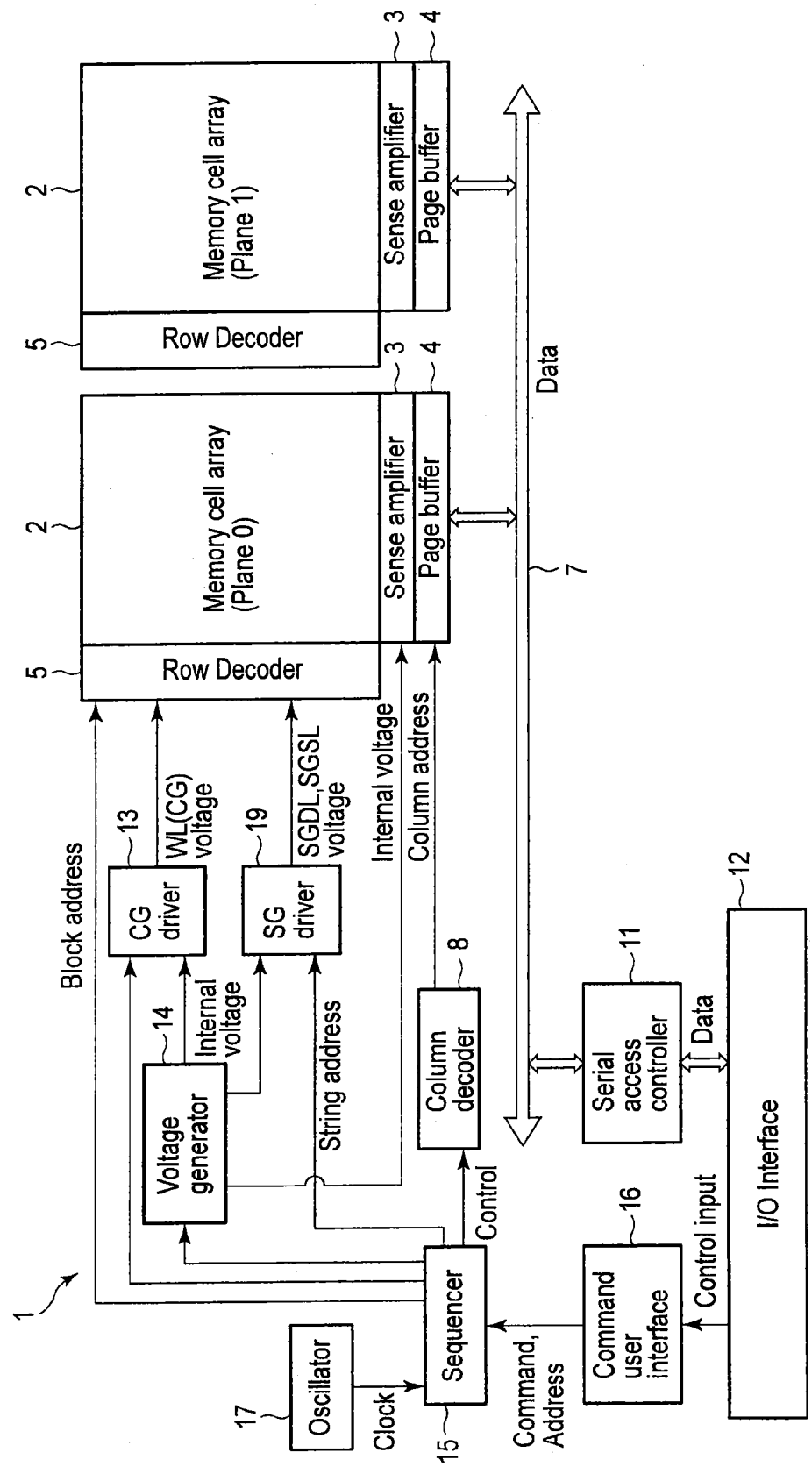
FIG. 1 illustrates a block diagram of a semiconductor memory device according to a first embodiment.

In general, according to one embodiment, semiconductor memory device includes memory cell arrays each including blocks. The block is unit of erase and includes a plurality of string-groups. Each string-group includes strings each including a first transistor, memory cell transistors, a second transistor coupled in series. The first transistor is connected to different bit line and the second transistor is connected to same source line. The memory cell arrays are provided with different respective block address signals. The memory cell arrays are provided with different respective string address signals. Each of the block address signals specifies one block. Each of the string address signals specifies one string-group.

(First Embodiment)

For reference, description will be briefly made of the conventional, or non-three-dimensional structure NAND flash memory, which may be referred to as a plane memory, and the BiCS memory. Each memory cell array of the NAND flash memory includes memory cell units, or strings. Each string includes a NAND string and two select gate transistors at both ends thereof. The NAND string includes serially-coupled memory cell transistors. One of the select gate transistors is coupled to a bit line, and the other of the select gate transistors is coupled to a source line. Multiple strings are coupled between corresponding one of the bit lines and the source line. Control gate electrodes of respective cell transistors belonging to the same row are coupled to the same word line. The memory space of multiple cell transistors which share a word line is referred to as a page. In the plane memory, only one string is coupled between a bit line and the source line in a block. A block is the erase unit of data.

Data is written or read per page. Specifically, access is made per page. For access, the word line of the page to be accessed is selected. However, in fact, not only the selected word line is set to a specific potential, but unselected word lines and gate electrodes of respective select gate transistors (or select gate lines) in the same string including the selected word line are set to respective specific potentials. Specifically, for access, the potentials applied to the selected word line, unselected word lines, and select gate lines have a specific pattern over the string. The selected word line, unselected word lines, and select gate lines are driven by a set of drivers.

The NAND flash memory may include multiple planes. The planes include respective memory cell arrays, and are provided with the same address space. A row decoder, sense amplifier, and the like are exclusively provided for each plane. In contrast, some components are shared by the planes. For example, one set of drivers is provided for the planes. Providing multiple planes allows for simultaneous access to pages of respective planes, and an improved access efficiency. In such a simultaneous access, different blocks can be specified in different planes. In contrast, the pattern of potentials of the word lines and select gate lines in the string is common to the planes because only one driver set is provided to the planes as described above. However, if writing is controlled so that cross-related data to be simultaneously read such as separate sections in the same file data is stored in pages to be accessed simultaneously, multiple planes are useful. Relatively high selectivity is possible even with only one possible potential pattern within the block. Thus, a destination to be accessed is specified by the address of two levels, i.e. a block and a page (word line), in a plane.

In contrast, in the BiCS memory, because of the structure for implementing the three-dimensional structure, multiple strings are coupled in parallel between a bit line and the source line in a block. This is contrastive to the plane memory, which includes only one string. For access, the NAND string in only one string needs to be coupled to the corresponding bit line in the selected block. This is realized by selecting the select gate transistors only in the selected string. Therefore, a destination to be accessed is specified by the address of three levels, i.e., a block, a string, and a page (word line), in a plane. The BiCS memory may be also provided with multiple planes.

The BiCS memory may succeed many features from the plane memory. Such features include the control with the multiple planes. Specifically, a set of drivers is shared by the planes. Therefore, it is possible to select the same block or different blocks in different planes as described above; however only the same potential pattern is possible in the selected strings. Furthermore, only the same selected string is also possible in the selected blocks of respective planes. It is because only one string exists in one string in one block in the plane memory, and hence no situation to select a string in a block usually arises. This is also succeeded by the BiCS memory, which results in incapability of individual selection of a string in the selected block in the planes in the BiCS memory. This limits the selectivity for the multiple planes in the BiCS memory.

Embodiments will now be described with reference to drawings. Components with substantially the same functions and configurations will be referred to with the same reference numbers and repetitive descriptions will be given only when required. Note that figures are schematic. The following embodiments only illustrate devices and methods for embodying the technical idea of the embodiments, and the technical idea of the embodiments does not limit the material, form, structure, and arrangement, and the like, of components to the following examples. The technical idea of the embodiments may be variously changed in accordance with the scope of the claims.

FIG. 1 illustrates a block diagram of the semiconductor memory device according to the first embodiment. As shown in FIG. 1, the semiconductor memory device 1 includes components such as memory cell arrays 2, sense amplifiers 3, page buffers 4, a row decoder 5, a data bus 7, a column decoder 8, a serial access controller 11, an I/O interface 12, a CG driver 13, a voltage generator 14, a sequencer (or controller) 15, a command user interface 16, an oscillator 17 and SG drivers 19. The semiconductor memory device 1 corresponds to one semiconductor chip, for example. The semiconductor memory device 1 is controlled by an external controller, for example.

Each functional block may be implemented as hardware, computer software, or combination of the both. In order to clearly illustrate this interchangeability of hardware and software, descriptions will be made in terms of their functionality in general. It is not essential that the functional blocks are distinguished from one another as specific example of FIG. 1. For example, some of the functions may be performed by functional blocks different from those illustrated below. Moreover, the illustrated functional block may be divided into functional sub-blocks. The embodiments are not limited by the specification of the particular functional blocks.

The semiconductor memory device 1 includes more than one memory cell arrays 2. FIG. 1 illustrates two memory cell arrays 2; however the semiconductor memory device 1 may include three or more memory cell arrays 2. A memory cell array 2 may be referred to as a plane. The two planes are referred to as plane 0 and plane 1. Each memory cell array 2 includes memory blocks, which may be simply referred to as blocks hereinafter. Each block has strings. Each string includes serially-coupled memory cell transistors and two select gate transistors at both ends thereof. Multiple strings are coupled to a bit line. Specific multiple memory cell transistors share a word line. The memory space of memory cell transistors which share a word line configure one or more pages. Data is read and written per page, and erased per block. The memory cell array 2 has a three-dimensional structure based on a so-called the BiCS technique, and will be described later in detail.

A set of the sense amplifier 3, page buffer 4, and row decoder 5 is provided for each memory cell array 2. Each sense amplifier 3 includes sense amplifier units coupled to respective bit lines, and senses and amplifies the potential on the bit lines. Each page buffer 4 receives a column address, reads data from the specified memory cell transistors in accordance with the column address, temporarily stores the read data, and outputs it to the data bus 7 during reading. Each page buffer 4 receives data from outside the semiconductor memory device 1 through the data bus 7 in accordance with the column address, and temporarily stores the received data during writing. The column address is supplied by the column decoder 8.

The data bus 7 is coupled to the serial access controller 11. The serial access controller 11 is coupled to the I/O interface 12. The I/O interface 12 includes signal terminals, and allows the semiconductor memory device 1 to be interfaced with an external device. The serial access controller 11 performs control including translation between a parallel signal on the data bus 7 and a serial signal flowing through the I/O interface 12.

Each row decoder 5 receives a block address from the sequencer 15 and selects a block in accordance with the received block address. Specifically, each row decoder 5 is coupled to the CG driver 13, and couples outputs of the CG driver 13 to a selected block. The CG driver 13 receives voltages from the voltage generator 14, and, in accordance with control by the sequencer 15, generates voltages required for various operations of the semiconductor memory device 1 such as a read, write, and erase. The CG driver 13 is shared by the planes. The voltages output from the CG driver 13 are applied to the word lines.

An SG driver 19 is provided for each plane. Each SG driver 19 receives a string address from the sequencer 15, and selects a string in accordance with the received string address. Specifically, each SG driver 19 receives voltages from the voltage generator 14, and outputs the voltages only for a selected string. The voltages output from the SG driver 19 are applied to select gate lines (or gate electrodes of select gate transistors).

The voltage generator 14 also provides the sense amplifier 3 with voltages required for its operation. The sequencer 15 receives signals, such as a command and an address, from the command user interface 16, and operates in accordance with a clock from the oscillator 17. The sequencer 15 controls various components (functional blocks) in the semiconductor memory device 1 in accordance with the received signal. For example, the sequencer 15 controls the column decoder 8, CG driver 13, voltage generator 14 and SG drivers 19 in accordance with the received signals, such as the command and address. Moreover, the sequencer 15 outputs the aforementioned block address and string address in accordance with the received signals, such as the command and address. The block addresses are different for different planes, and include information for selecting the same block or different blocks for different planes. Similarly, the string addresses are different for different planes, and include information for selecting the same string or different strings for different planes. The command user interface 16 receives a control signal via the I/O interface 12. The command user interface 16 decodes the received control signal, and obtains commands and addresses, and the like.

The semiconductor memory device 10 may be configured to store data of two bits or more in a memory cell. For such a case, cell transistors coupled to the same word line have two or more pages, each of which is assigned an address. Such transistors in turn are collectively accessed. A write may be executed on a page-by-page basis or on all pages in transistors accessed.

Each memory cell array 2 has a structure, for example, shown in FIGS. 2 and 3. FIG. 2 is a perspective view of a part of the memory cell array according to the first embodiment. FIG. 3 is a sectional view of a part of the memory cell array according to the first embodiment. FIG. 2 illustrates two strings. FIG. 3 is along the yz plane.

As shown in FIGS. 2 and 3, a back gate BG of conductive material is formed above a substrate sub. The back gate BG extends along the xy plane. Strings Str are also formed above the substrate sub. A block includes i strings $Str_0$ to $Str_{i-1}$. i is a natural number. When reference numerals with a subscript (for example, strings $Str_0$ to $Str_{i-1}$) do not need to be distinguished from each other, a reference numeral without the subscript is used, and it refers to all reference numerals with the subscripts.

In FIG. 2, a string Str includes n memory cell transistors MTr. n is a natural number. FIGS. 2 and 3 illustrate an example of a string including sixteen cell transistors $MTr_0$ to $MTr_{15}$. Cell transistors $MTr_7$ and $MTr_8$ are coupled via a back gate transistor BTr. Respective first ends of a source-side select gate transistor SSTr and a drain-side select gate transistor SDTr are coupled to the cell transistors $MTr_0$ and $MTr_{15}$, respectively. The source lines SL and bit lines BL extend above the transistors SSTr and SDTr, respectively. Respective second ends of the transistors SSTr and SDTr are coupled to a source line SL and a bit line BL, respectively.

Figure 4:
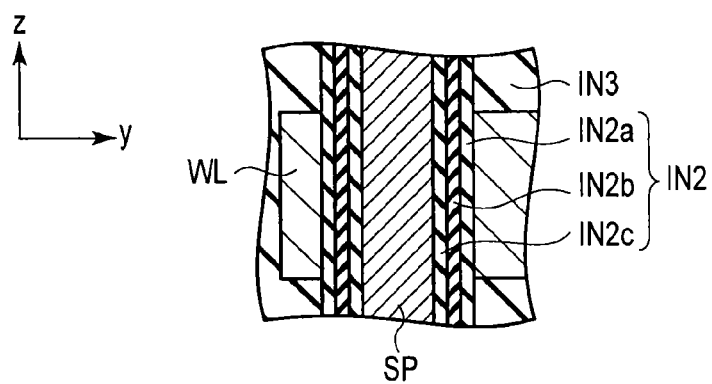
FIG. 4 illustrates a sectional view of a memory cell transistor according to v embodiment.

The cell transistors $MTr_0$ to $MTr_{15}$ include semiconductor pillars SP and insulator IN2 (shown in FIG. 4) on the surface of the semiconductor pillars SP. The semiconductors pillars SP include or consist of silicon above the back gate BG, for example. Two semiconductor pillars SP which configure one string STr are coupled by a pipe layer of conductive material in the back gate BG. The pipe layer configures the back gate transistor BTr. The insulator IN2 includes block insulator IN2a on the semiconductor pillar SP, a charge trapping layer IN2b on the insulator IN2a, and a tunnel insulator IN2c on the charge trapping layer IN2b, as shown in FIG. 4. The charge trapping layer IN2b includes or consist of insulating material.

As shown in FIGS. 2 and 3, the cell transistors $MTr_0$ to $MTr_{15}$ further include word lines (control gate) $WL_0$ to $WL_{15}$ extending along with the x-axis, respectively. The word lines $WL_0$ to $WL_{15}$ are selectively coupled to corresponding CG line CGs (CG lines $CG_0$ to $CG_{15}$) by the row decoder 5, respectively. The CG lines CG are not shown in FIGS. 2 and 3. The cell transistors MTr non-volatilely store data determined in accordance with the number of carriers in the charge trapping layers IN2b.

Gate electrodes (or gates) of respective cell transistors $MTr_0$ of respective strings $Str_0$ in a line along with the x-axis in a block MB is commonly coupled to a word line $WL_0$. Similarly, gates of respective cell transistors $MTr_X$ of respective strings $Str_0$ in a line along with the x-axis in a block MB are commonly coupled to a word line $WL_X$. X is zero or a natural number less than or equal to n. Furthermore, the same holds true for other strings Str. Specifically, gates of respective cell transistors $MTr_X$ of respective strings $Str_Y$ in a line along with the x-axis in a block MB are commonly coupled to a word line $WL_X$. Y is zero or a natural number less than or equal to i. The word line $WL_0$ is also shared by all the strings Str in a block MB. The word lines $WL_1$ to $WL_R$ are also shared similarly. In other words, a block MB includes a feature of sharing word lines over different strings, and has a structure different from other structures such as that of a string Str, or that of two adjacent strings Str shown in FIG. 2. Moreover, a block MB has a feature of the same bias applied to its all strings during the erasure, and hence the block MB is an erase unit. The gates of respective back gate transistors BTr are commonly coupled to the back gate line BG.

A set of cell transistors MTr coupled to the same word line WL configure one or more pages. A page has the size of 8K bytes, for example.

The select gate transistors SSTr and SDTr include the semiconductor pillars SP and gate insulator (not shown) on the surface of the semiconductor pillar SP, and further include gates (select gate lines) SGSL and SGDL, respectively. Source/drain areas (not shown) are formed in the semiconductor pillars SP.

Gates of respective source-side select gate transistors SSTr of respective strings $Str_0$ in a line along with the x-axis in a block MB are commonly coupled to a source-side select gate line $SGSL_0$. Similarly, gates of respective transistors SSTr of respective strings $Str_Y$ in a line along with the x-axis in a block MB are commonly coupled to a select gate line $SGSL_Y$. The select gate lines SGSL extend along with the x-axis. The select gate lines SGSL are selectively coupled to respective SG lines SGS (not shown) by the row decoder 5. First ends of respective transistors SSTr of the two adjacent strings Str are coupled to the same source line SL. The source lines SL in a block are coupled to each other.

Gates of respective drain-side select gate transistors SDTr of respective strings $Str_0$ in a line along with the x-axis in a block MB are commonly coupled to a drain-side select gate line $SGDL_0$. Similarly, gates of respective transistors SDTr of respective strings $Str_Y$ in a line along with the x-axis in a block MB are commonly coupled to a select gate line $SGDL_Y$. The select gate lines SGDL extend along with the x-axis. The select gate lines SGDL are selectively coupled to respective SG lines SGD (not shown) by the row decoder 5. First ends of respective transistors SDTr of all strings Str in a line along with the y-axis in a block are coupled to the same bit line BL.

As described above, strings $Str_Y$ in a line along with the x-axis in a block MB (or those coupled to different bit lines BL) share the select gate lines SGSL and SGDL and the word lines $WL_0$ to $WL_{15}$. For this reason, not only a structure of a set of the memory cell transistors and select gate transistors is referred to as a string, but strings Str (string-group) which share select gate lines SGSL and SGDL and word lines $WL_0$ to $WL_{15}$ and are coupled to different bit lines are also referred to as a string. In fact, selecting a particular string Str results in selecting a set of strings which is coupled with the select gate lines SGSL and SGDL and the word lines $WL_0$ to $WL_{15}$ of the particular string and coupled to different bit lines BL. Therefore, description of "to select a string" and grammatically variants thereof refer to either one of or both of "to select a string" and "to select a string-group" in the detailed description and claims.

Figure 5:
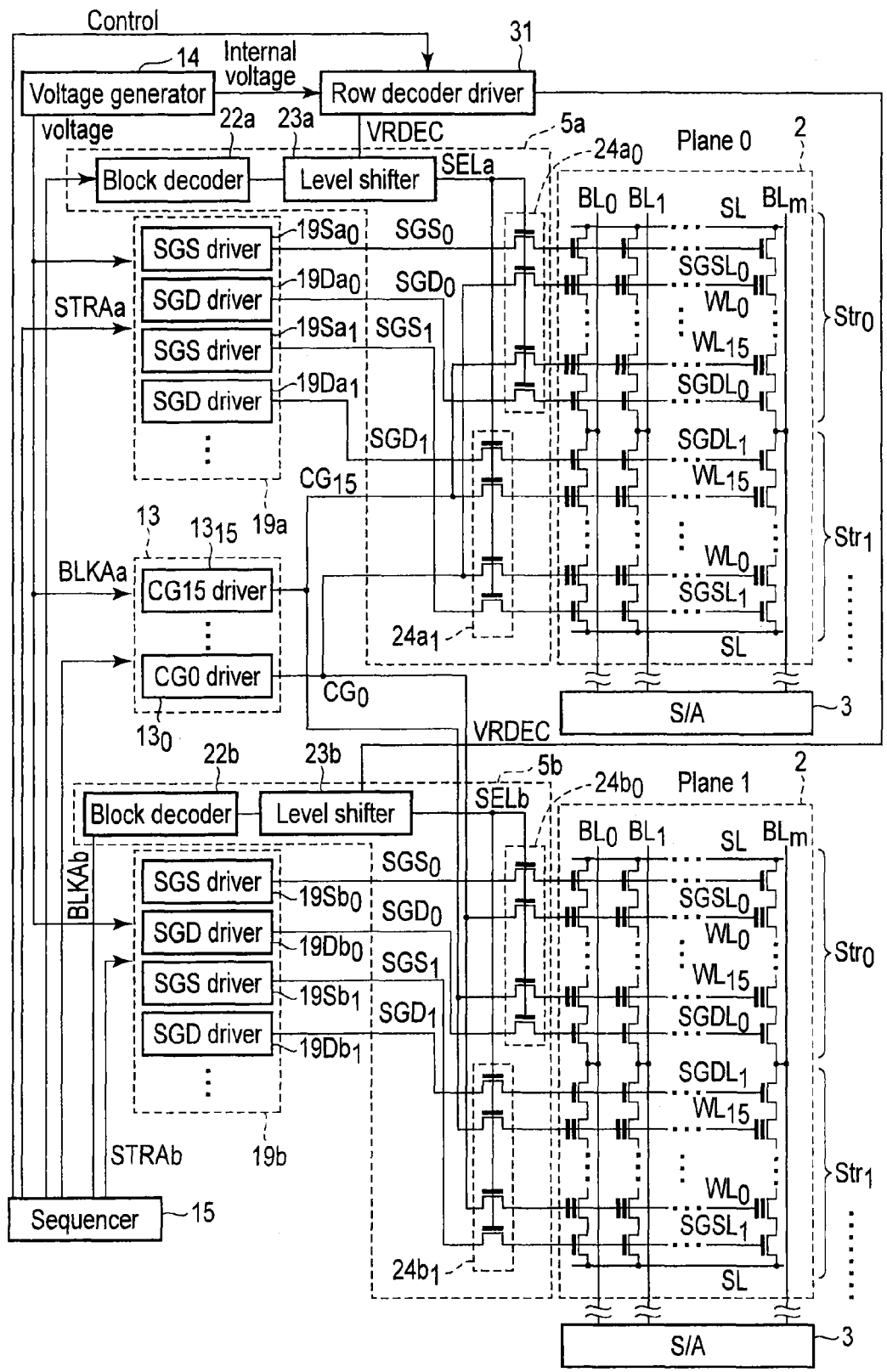
FIG. 5 illustrates a block diagram of a part of the semiconductor memory device according to the first embodiment.

FIG. 5 is a block diagram of a part of the semiconductor memory device according to the first embodiment. In particular, FIG. 5 illustrates components associated with decoding of FIG. 1, and relevant components. As shown in FIG. 5, a row decoder 5a and an SG driver 19a for plane 0 and a row decoder 5b and an SG driver 19b for plane 1 are provided. The row decoders 5a and 5b have the same configuration (or a set of components and connection), and SG drivers 19a and 19b have the same configuration. In the following, the components regarding plane 0 will be described; however, the following description also applies to plane 1. In particular, the description with names of components with their "a" replaced with "b" applies as that for plane 1. The semiconductor memory device of FIG. 5 also corresponds to one semiconductor chip as described with reference to FIG. 1, for example.

The CG driver 13 includes sixteen (being equal to an example number n of the memory cell transistors Mtr in a string) CG drivers $130_0$ to $130_{15}$. The CG drivers $13C_0$ to $13C_{15}$ drive the CG lines $CG_0$ to $CG_{15}$ to specific potentials determined in accordance with the control by the sequencer 15, respectively. The CG drivers $13C_0$ to $13C_{15}$ receive various voltages from the voltage generator 14.

The SG driver 19a includes i SGD drivers $19Da_0$ to $19Da_{i-1}$ and i SGS drivers $19Sa_0$ to $19Sa_{i-1}$. The SGD drivers $19Da_0$ to $19Da_{i-1}$ drive SG lines $SGD_0$ to $SGD_{i-1}$ of plane 1 to a potential determined in accordance with control by the sequencer 15, respectively. The SGS drivers $19Sa_0$ to $19Sa_{i-1}$ drive SG lines $SGS_0$ to $SGS_{i-1}$ of plane 1 to a potential determined in accordance with control by the sequencer 15, respectively. The drivers $19Da_0$ to $19Da_{i-1}$ and $19Sa_0$ to $19Sa_{i-1}$ receive various voltages from the voltage generator 14.

The row decoder 5a includes a block decoders 22a, level shifter 23, and i transfer transistors groups $24a_0$ to $24a_{i-1}$. A transfer transistors group $24a_0$ is provided for the string $Str_0$. Similarly, a transfer transistors group $24a_Y$ is provided for a string $Str_Y$.

The transfer transistors group $24a_0$ includes n+2 (being equal to 18) transfer transistors. The eighteen transfer transistors selectively couple the SG lines $SGDa_0$ and $SGSa_0$ to the select gate lines $SGDL_0$ and $SGSL_0$ of the string $Str_0$, respectively, and the CG lines $CG_0$ to $CG_{15}$ to the word lines $WL_0$ to $WL_{15}$, respectively. Similarly, a transfer transistors group $24a_Y$ includes eighteen transfer transistors. The eighteen transfer transistors selectively couple the SG lines $SGDa_Y$ and $SGDa_Y$ to the select gate lines $SGDL_Y$ and $SGSL_Y$ of a string $Str_Y$, respectively, and the CG lines $CG_0$ to $CG_{15}$ to the word lines $WL_0$ to $WL_{15}$, respectively.

Actually, each block is provided with a set of a block decoder 22a, a level shifters 23a, and i transfer transistors groups $24a_0$ to $24a_{i-1}$ of FIG. 5. The SGD lines SGDY of respective strings $Str_Y$ of all blocks MB in one plane are coupled to an output of the driver $19Da_Y$, and the SGS lines $SGS_Y$ of respective strings $Str_Y$ of all blocks MB in one plane are coupled to an output of the driver $19Sa_Y$. All block decoders 22a receive a block address signal BLKAa from the sequencer 15. The block address signal BLKAa includes information to specify a block MB. The block decoders 22a decode the block address signal BLKAa, and a block decoder 22a specified by the block address signal BLKAa operates. In other words, a block decoder 22a is selected in accordance with the signal BLKAa. FIG. 5 illustrates only components associated with a selected block in plane 0.

The selected block decoder 22a outputs a signal SELa level-shifted by the level shifter 23a. The signal SELa is supplied to the gates of respective transfer transistors in transfer transistors groups $24a_0$ to $24a_{i-1}$ for the selected block, and turn on these transfer transistors. The level shifter 23a receives a necessary voltage VRDEC from a row decoder driver 31. The row decoder driver 31 receives necessary voltage from the voltage generator 14, and generates the voltage VRDEC. The row decoder driver 31 is implemented as a part of the function of the voltage generator 14, and is included in the voltage generator 14, for example.

All drivers $19Da_0$ to $19Da_{i-1}$ and $19Sa_0$ to $19Sa_{i-1}$ receive the string address signal STRAa from the sequencer 15. The string address signal STRAa includes information to specify a string Str. Then, a pair of drivers $19Sa_Y$ and $19Da_Y$ for a string $Str_Y$ specified by the string address signal STRAa drive the SG lines $SGS_Y$ and $SGD_Y$, respectively. The drivers $19S_a$ and $19D_a$ for unselected strings Str do not operate. As a result, only in the selected string Str, the select gate lines SGSL and SGDL are driven via corresponding transfer transistors. In this way, in plane 0, only in the selected string Str in the selected block MB, the cell transistor $MTr_0$ and $MTr_{15}$ are coupled to the source line SL and the corresponding bit line BL, respectively.

The same holds true for plane 1 as described above with the following exceptions. That is, the block decoder 22b for plane 1 receives a block address signal BLKAb. The block address signal BLKAb differs from the block address signal BLKAa. Accordingly, for plane 1, a block decoder 22b, a level shifter 23b, transfer transistors groups $24b_0$ to $24b_{i-1}$ for a block specified by the block address signal BLKAb operate. Moreover, the sequencer 15 selects one of the i strings with the string address STRAb. A pair of drivers $19Sb_Y$ and $19Db_Y$ for a selected string $Str_Y$ operates. In this way, in plane 1, only in the selected string Str in the selected block MB, the cell transistor $MTr_0$ and $MTr_{15}$ are coupled to the source line SL and the corresponding bit line BL, respectively.

The string address signals STRAa and STRAa are different, and hence the selected string in plane 0 and that in plane 1 are independent from each other, and may be the same or different. In other words, different strings can be individually selected among planes during simultaneous access to the planes. For this purpose, the sequencer 15 outputs different string address signals STRAa and STRAb.

The description so far has been made for a case of the semiconductor memory device 1 including two planes. A case of three or more planes, however, can be implemented in accordance with the described principles. Specifically, the same set of components associated with the decoding for a plane in FIG. 5 is provided for each of all planes, and the sequencer 15 is configured to output individual string addresses STRA for respective planes.

As described, in the semiconductor memory device according to the first embodiment, each plane is provided with a driver 19, and an independent string address STRA for each plane is formed. The string address STRA include information to select a string. This allows for driving the word lines WL and the select gates lines SGDL and SGSL in a block and a string both selected independently for each plane. Although a CG driver 13 serves for the planes, and hence the patterns of potentials of the word lines WL are the same among the planes, a high selectivity can be realized through the individual selection of a string Str for each plane.

(Second Embodiment)

The second embodiment is based on the first embodiment.

Figure 6:
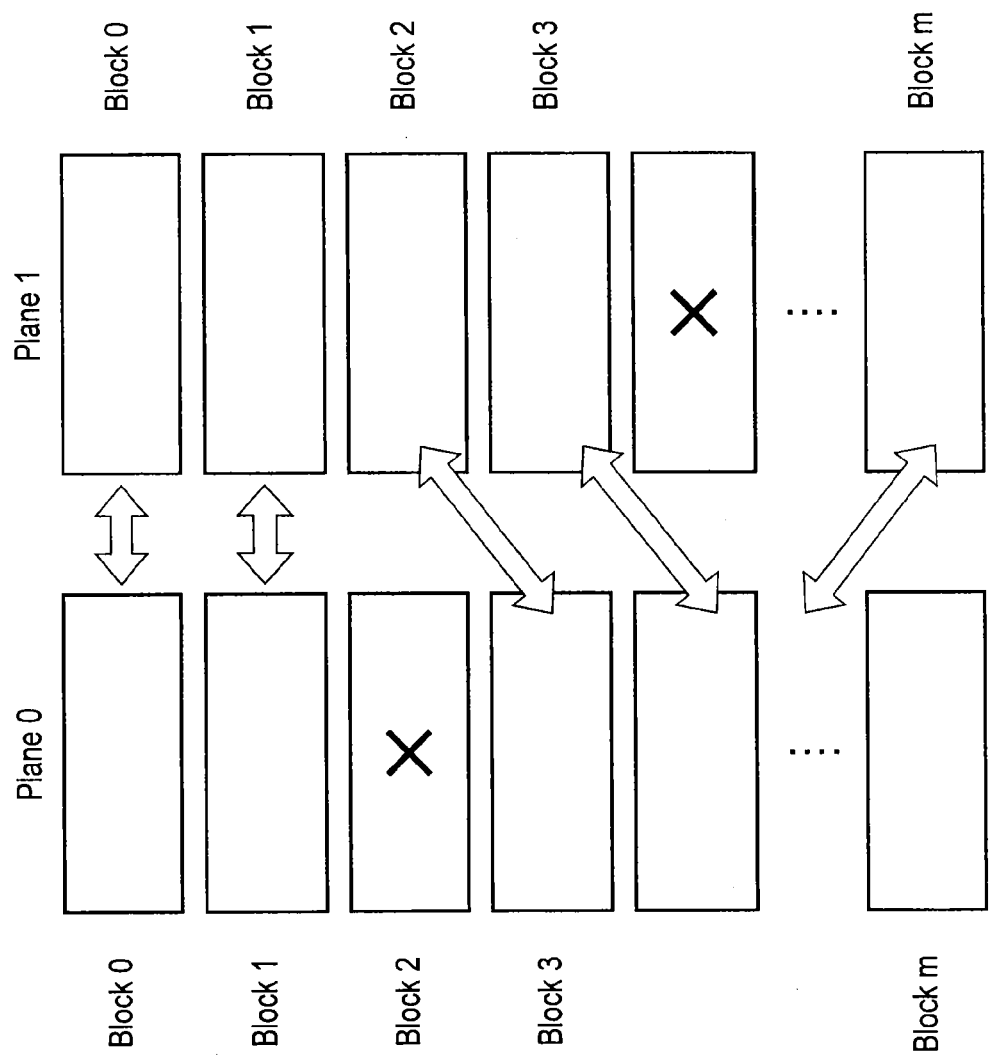
FIG. 6 illustrates an example of parallel access to two planes in a plane memory.

As described above, a NAND flash memory may include multiple planes. The planes are accessed simultaneously and a read or write is executed in a block selected from each plane. Moreover, blocks including a defect are treated as bad blocks, and blocks including no defect in each plane are used as control units. FIG. 6 illustrates an example of parallel accesses to two planes in a plane memory. As shown in FIG. 6, respective blocks 0 of planes 0 and 1 are accessed in parallel, and respective blocks 1 of planes 0 and 1 are accessed in parallel. In this example, block 2 of plane 0 is defective (a block with sign X). For this reason, block 3 of plane 0 and block 2 of plane 1 make a pair, and are accessed in parallel.

Figure 7:
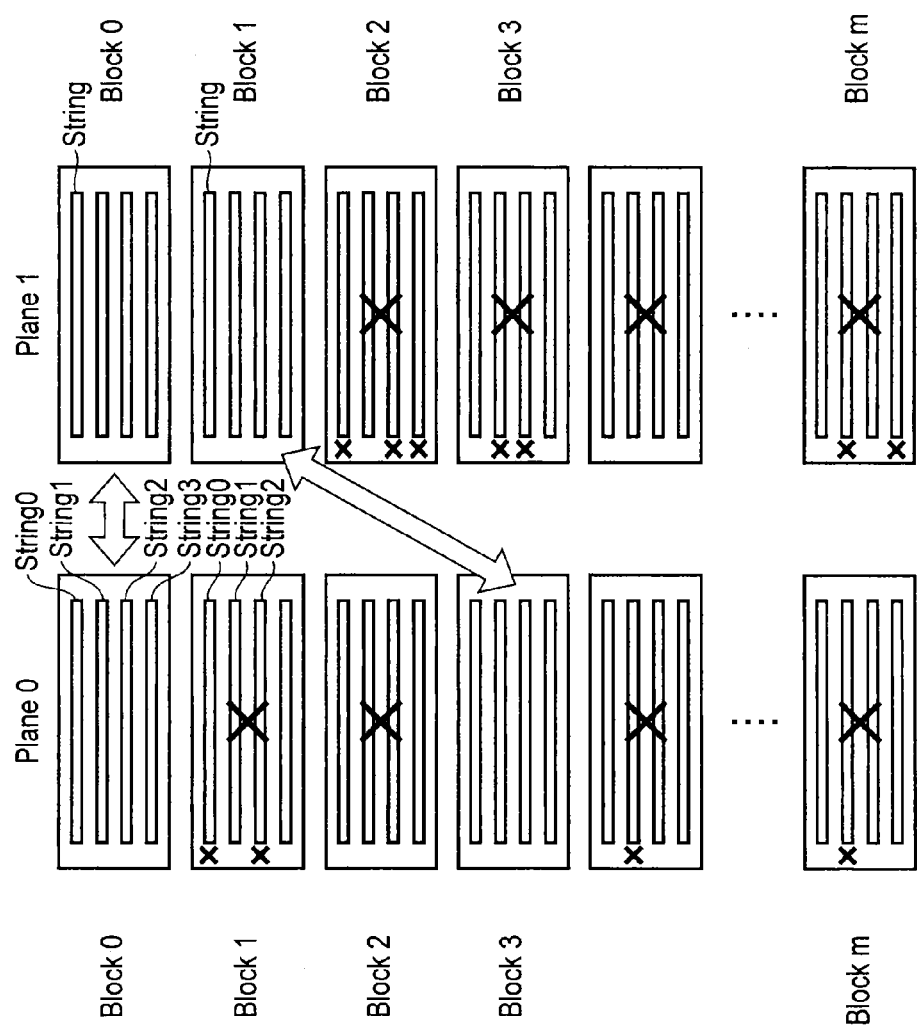
FIG. 7 illustrates an example of parallel access to two planes in a BiCS memory.

As shown in FIG. 7, the same access is also possible in a BiCS memory. FIG. 7 illustrates an example of parallel accesses to two planes in a BiCS memory. However, the parallel access in the BiCS memory is different from that in the plane memory as follows because of a block in the BiCS memory including multiple strings. FIG. 7 illustrates only four strings $Str_0$ to $Str_3$ in a block for the purpose of simplification. In the FIG. 7 example, respective blocks 0 of planes 0 and 1 are accessed in parallel. In contrast, block 1 of plane 0 includes defective strings $Str_0$ and $Str_2$ (strings with the sign X at their sides). When a defect exists, the string including this defect is treated as defective. Strings other than strings $Str_0$ and $Str_2$ are good. However, the whole block 1 of plane 0 is treated as a bad block, and block 3 of plane 0 and block 1 of plane 1 are accessed in parallel, for example. This is because different strings cannot be selected in respective selected blocks in different planes as described in the beginning of the description for the first embodiment. Specifically, the same number strings Str can only be selected in the same or different blocks in respective planes, which disables parallel access to good string $Str_1$ of block 1 of plane 0 and string $Str_0$ of block 1 of plane 1. Therefore, the whole block must be treated as a bad block. This, however, also requires that even a block including only one defective string be treated as bad. This contrasts to the plane memory, where a block only includes a string and hence treating a block with a defective string as bad to disable such a block does not sacrifice good strings. In the BiCS memory, however, there is no way to use other good strings, and it is necessary to provide many redundant blocks to be replaced by defective blocks. With such a background, the individual string selection by the first embodiment is used to configure the second embodiment.

Figure 8:
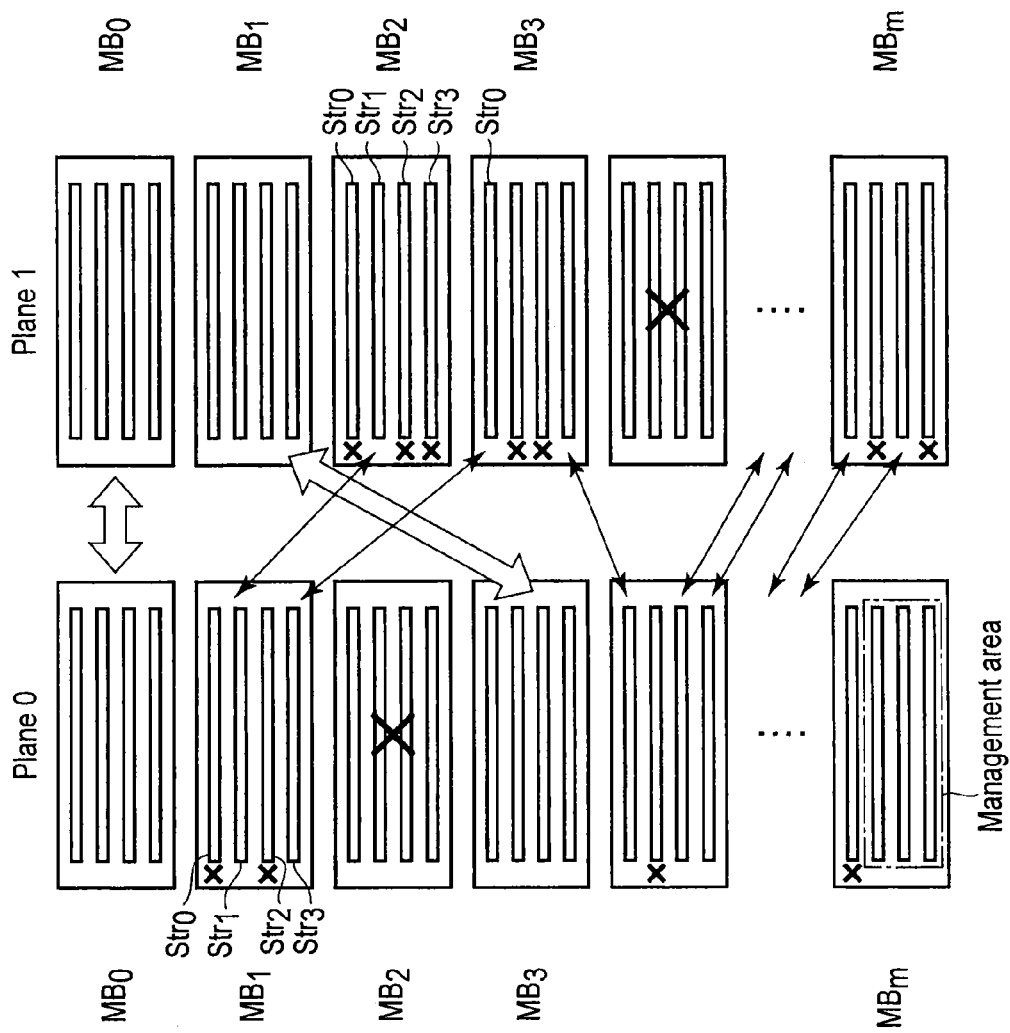
FIG. 8 illustrates an example of control in a semiconductor memory device according to a second embodiment.

FIG. 8 illustrates an example of control in the semiconductor memory device according to the second embodiment. The second embodiment uses the first embodiment, and the description of the first embodiment is applicable to all features in the second embodiment except for the following. FIG. 8 relates to an example for two planes. Moreover, FIG. 8 shows four strings Str per block MB for the purpose of simplification.

As shown in FIG. 8, respective blocks $MB_0$ of the planes 0 and 1 are good, and include no defective string. Therefore, block $MB_0$ of plane 0 and block $MB_0$ of plane 1 make a pair (or set) accessed in parallel. Blocks which make a pair are connected by a thick arrow. A defective string and an opposing good string are strings determined with and without a defect in accordance with some criteria, respectively. A good block includes no defective string.

Components to make "a pair" or "a set" in the detailed description and claims refer to a pair or set accessed in parallel, respectively. For example, the same number strings Str of block $MB_0$ of plane 0 and block $MB_1$ of plane 1 make a pair. Alternatively, the ability to specify different strings in respective blocks of different planes can be used to make different number strings of block $MB_0$ of plane 0 and block $MB_1$ of plane 1 make a pair.

Block $MB_1$ of plane 1 is good. In contrast, block $MB_1$ of plane 0 includes defective strings $Str_0$ and $Str_2$. Therefore, block $MB_1$ of plane 1 makes a pair with a good block MB other than block $MB_1$ of plane 0. For example, block $MB_1$ of plane 1 makes a pair with block $MB_3$ of plane 0. In the current context, block $MB_2$ of plane 0 is bad as a whole and includes no good string. Such a block with no good string may be a block including a short-circuited word line WL. Thus, a good block MB of plane 0 and a good block of plane 1 makes a pair. In other words, a good block of a plane makes a pair with a good block of another plane.

In contrast, good string $Str_1$ of block $MB_1$ of plane 0 makes a pair with a good string Str of a bad-string-including block of plane 1. Strings Str which make a pair are connected by a thin arrow. For example, block $MB_2$ of plane 1 includes defective strings $Str_0$, $Str_2$, $Str_3$, and good string $Str_1$. Thus, good string $Str_1$ of block $MB_0$ of plane 0 makes a pair with good string $Str_1$ of block $MB_2$ of plane 1. String $Str_3$ of block $MB_1$ of plane 0 makes a pair with string $Str_0$ of block $MB_3$ of plane 1. Block $MB_3$ of plane 1 includes good strings $Str_0$ and $Str_3$ and defective strings $Str_1$ and $Str_2$.

In accordance with the above principle, each good block MB of plane 0 makes a pair with a good block MB of plane 1, and each good string Str of plane 0 makes a pair with a good string Str of plane 1. A good block MB of plane 0, however, may be unable to make a pair with a good block MB of plane 1 due to the number of defective strings. In such a case, a good string Str of a good block MB which fails to make a pair in plane 0 makes a pair with a good string Str of a block MB which includes a defective string Str in plane 1. When even such a matching-up fails to make a good block MB or string Str of a plane make a pair with a good block MB or string Str of another plane, such a block MB and string Str (for example, strings $Str_1$ to $Str_3$ of block MBm of plane 0) are used as a management area. A management area is used to store management data. The management data is used by the semiconductor memory device 1 itself aside from user data supplied from outside the semiconductor memory device 1, for example.

FIG. 8 illustrates an example where a good string Str of plane 0 makes a pair with, among unpaired strings of plane 1, the string Str with the address minimum in the ascending order of blocks MB and strings Str. The second embodiment, however, is not limited to such an example, and a string Str of a plane can make a pair with any unpaired string Str of another plane. The same applies to the blocks MB, i.e., a block MB of a plane can make a pair with any unpaired block of another block.

The sequencer 15 is configured to execute writes and reads to pairs and sets made in accordance with the principle of the second embodiment as well as the control described in connection with the first embodiment.

Figure 9:
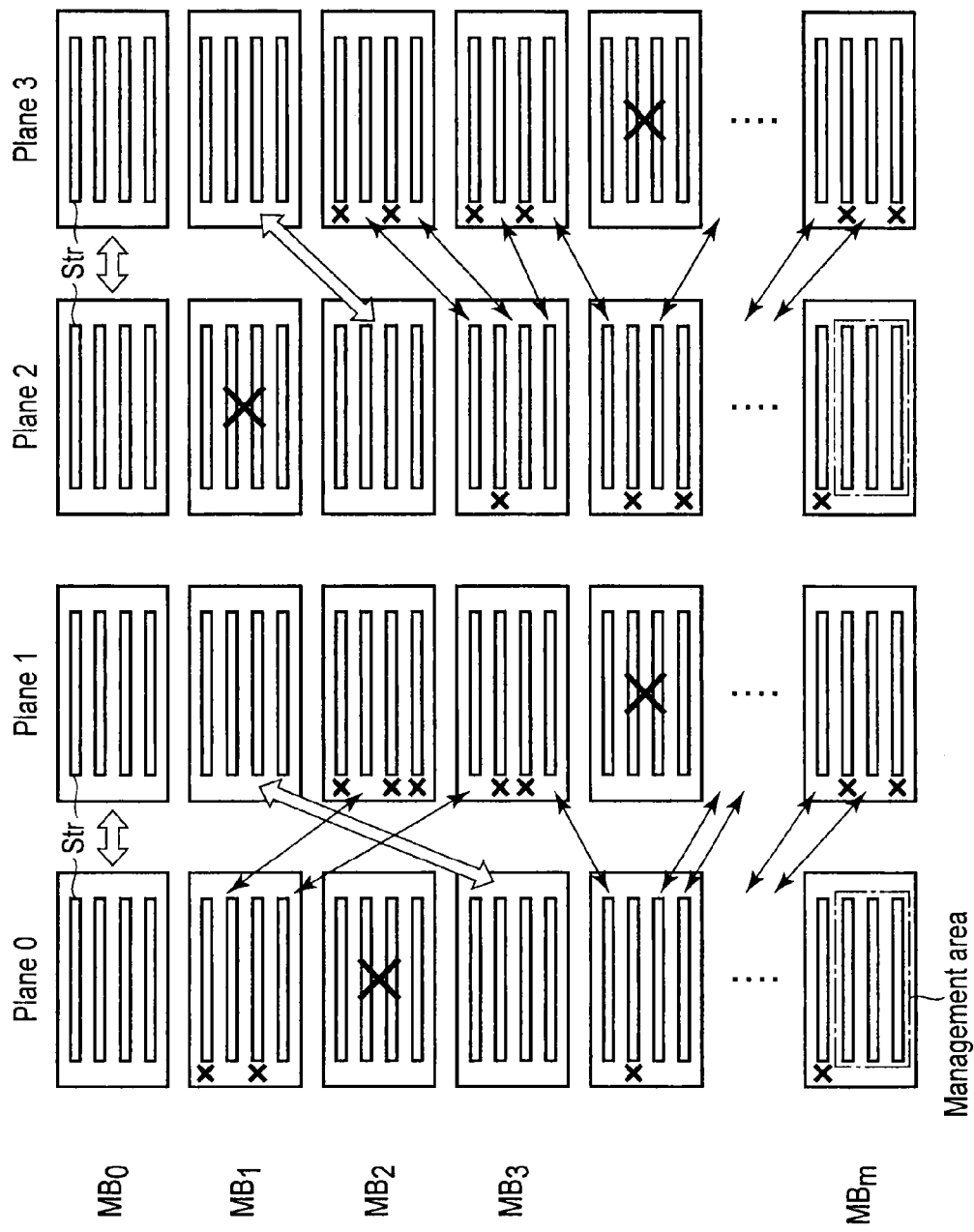
FIG. 9 illustrates a second example of control in the semiconductor memory device according to the second embodiment.

The description so far has been given for a two-plane example. The second embodiment is also applicable to three or more planes. FIG. 9 illustrates a second example control in the semiconductor memory device according to the second embodiment. FIG. 9 is related to an example of four planes. FIG. 9 also shows a four strings Str per block MB for the purpose of simplification. As shown in FIG. 9, a good block MB or string Str of plane 0 make a pair, with a good block MB or string Str of plane 1 as described with reference to FIG. 8. Similarly, a good block MB or string Str of plane 2 makes a pair with a good block MB or string Str of plane 3 in accordance with the same principle as that described with reference to FIG. 8. In other words, blocks MB or strings Str of planes 0 and 1 are accessed in parallel, and blocks MB or strings Str of planes 2 and 3 are accessed in parallel. The parallel access to planes 0 and 1 and that to planes 2 and 3 may occur at the same timing or different timings. One or more additional parallel-accessed pairs (for example, planes 4 and 5) may be provided.

Figure 10:
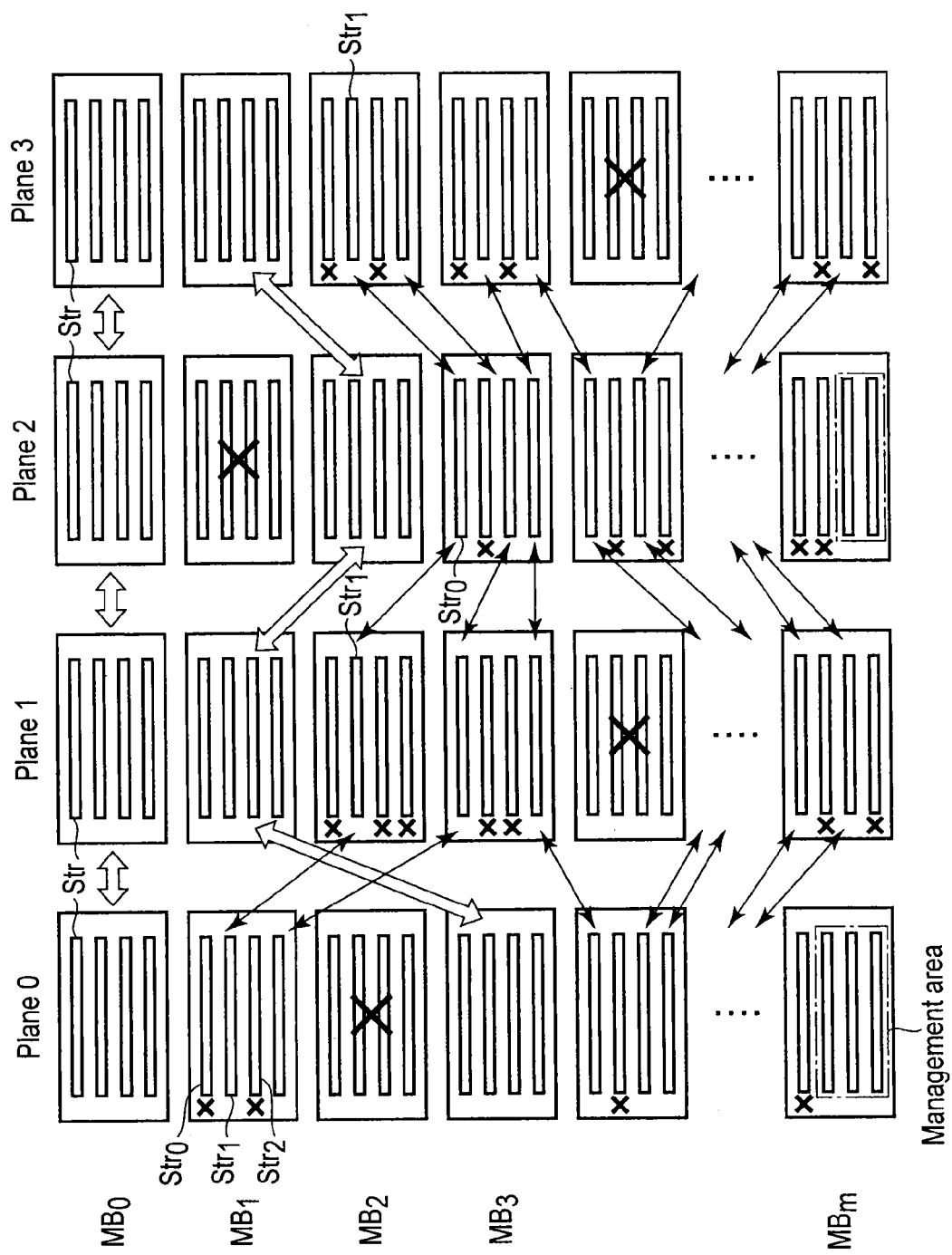
FIG. 10 illustrates a third example of control in the semiconductor memory device according to the second embodiment.

Moreover, as shown in FIG. 10, three or more planes may be accessed in parallel. FIG. 10 illustrates a third example of control in the semiconductor memory device according to the second embodiment. FIG. 10 is related to an example of four planes. FIG. 10 also shows a four strings Str per block MB for the purpose of simplification. In the FIG. 10 example, blocks MB or strings Str of four planes are accessed in parallel. Respective blocks $MB_0$ of planes 0 to 3 are good, and therefore make a set accessed in parallel. Blocks which make a set are connected by a thick arrow.

In contrast, block $MB_1$ of plane 0 includes defective string $Str_0$ and $Str_2$, those of planes 1 and 3 are good, and that of plane 2 is bad, and furthermore, the following block $MB_2$ of plane 0 is bad. This results in a set of good block $MB_3$ of plane 0, good blocks $MB_1$ of planes 1 and 3, and good block $MB_2$ of plane 2.

As for strings, good strings Str of blocks MB of defective-string-including blocks MB of planes 0 to 4 make a set in accordance with the principle described with reference to FIG. 8. In the FIG. 10 example, good string $Str_1$ of block $MB_1$ of plane 0, good string $Str_1$ of block $MB_2$ of plane 1, good string $Str_0$ of block $MB_3$ of plane 2, and good string $Str_1$ of block $MB_2$ of plane 3 make a set, for example.

As described above, the semiconductor memory device according to the second embodiment forms the string address STRA which specifies a string independent for each plane as in the first embodiment. This can produce the same advantages as the first embodiment. Moreover, according to the second embodiment, a good string Str of a block MB including defective string Str of a plane makes a pair or set with a good string Str of a block MB including a defective string Str of another plane. This avoids a whole defective-string-including block MB being treated as bad, which makes the defective-string-including block MB available, and such a block MB can be effectively used. Therefore, the number of bad blocks decreases, and hence the number of required redundant blocks also decreases, which can suppress an increase of the chip area of the semiconductor memory device 1.

Structure of the memory cell array 10 is not limited as above description. A memory cell array formation may be disclosed in U.S. patent application Ser. No. 12/532,030 and U.S. patent application Ser. No. 12/532,030, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   memory cell arrays each comprising blocks, the block being unit of erase and comprising a plurality of string-groups, each string-group comprising strings, each string comprising a first transistor, memory cell transistors, a second transistor coupled in series, the first transistor being connected to different bit line and the second transistor being connected to same source line,
   wherein
   the memory cell arrays are provided with different respective block address signals,
   the memory cell arrays are provided with different respective string address signals,
   each of the block address signals specifies one block,
   each of the string address signals specifies one string-group,
   a first string group of a first one of the memory cell arrays and a second string group of a second one of the memory cell arrays are accessible in parallel, and
   an address of the first string group and an address of the second string group are specified separately.

2. The device of claim 1, further comprising a first driver set for each memory cell array, and wherein the first driver set:
   receives a string address signal; and
   drives a first line selectively coupled to a gate of a first transistor of a string-group specified by the string address signal, and drives a second line selectively coupled to a gate of a second transistor of the specified string.

3. The device of claim 2, wherein:
   the first driver sets comprises first driver pairs, each first driver pair being provided for each corresponding string-groups; and
   each first driver pair is coupled to a first line selectively coupled to a gate of a first transistor of a corresponding string-group, and coupled to a second line selectively coupled to a gate of a second transistor of the corresponding string.

4. The device of claim 3, wherein one first driver pair corresponding to one string-group specified by the string address signal drives corresponding first and second lines.

5. The device of claim 4, wherein first driver sets corresponding to respective string-groups other than the specified string do not operate.

6. The device of claim 5, wherein:
   the device further comprises decoders, the decoders being provided for each memory cell array;
   the decoders receive a corresponding block address signal; and
   one decoder for one block specified by the block address signal couples one first driver pair corresponding to each of string-groups of the specified block to a gate of a first transistor and a gate of a second transistor of a corresponding string-group, respectively.

7. The device of claim 6, further comprising second drivers which output voltages applied to respective gates of the memory cell transistors.

8. The device of claim 7, wherein one decoder for the specified block couples respective outputs of the second drivers to respective gates of memory cell transistors of each of string-groups of the specified block.

9. The device of claim 8, wherein the second drivers are selectively coupled to respective gates of memory cell transistors of each of the memory cell arrays, respectively.

10. The device of claim 1, further comprising a controller which outputs the block address signals and the string address signals.

11. The device of claim 1, wherein, in one block, memory cell transistors of respective string-groups share a word line.

12. The device of claim 1, wherein:
   the first and second memory cell arrays are accessed in parallel; and
   one string-group of the first memory cell array and one string-group of the second memory cell array make a set.

13. The device of claim 12, wherein one good string-group of one block including a defective string-group of the first memory cell array and one string of the second memory cell array make a set.

14. The device of claim 13, wherein one block which includes no defective string-group of the first memory cell array and one block which includes no defective string-group of the second memory cell array make a set.

15. The device of claim 14, wherein a string-group or block which does not make a set of the first memory cell array stores management data.

16. The device of claim 12, further comprising a controller which accesses string-groups which make a set in parallel.

17. The device of claim 12, wherein:
   a third one of the memory cell arrays is accessed in parallel with the first and second memory cell arrays; and
   one string-group of the first memory cell array, one string-group of the second memory cell array, and one string-group of the third memory cell array make a set.

* * * * *